United States Patent [19]

Ceperley

[11] Patent Number: 4,686,407
[45] Date of Patent: Aug. 11, 1987

[54] SPLIT MODE TRAVELING WAVE RING-RESONATOR

[76] Inventor: Peter H. Ceperley, 4803 Clemons Ct., Annandale, Va. 22003

[21] Appl. No.: 891,590

[22] Filed: Aug. 1, 1986

[51] Int. Cl.[4] ............................................. H01L 41/08
[52] U.S. Cl. ..................................... 310/323; 60/721; 62/467; 116/DIG. 22; 310/321; 310/328; 310/316
[58] Field of Search ............... 310/311, 321, 325, 323, 310/328, 26, 316; 60/721; 62/467 R; 116/DIG. 22

[56] References Cited

U.S. PATENT DOCUMENTS

| | | | |
|---|---|---|---|
| 3,708,745 | 1/1973 | McMaster et al. | 310/325 X |
| 4,114,380 | 9/1978 | Ceperley | 60/721 |
| 4,355,517 | 10/1982 | Ceperley | 60/721 |
| 4,504,760 | 3/1985 | Yamamoto et al. | 310/323 |
| 4,510,411 | 4/1985 | Hakamata et al. | 310/316 |
| 4,546,498 | 12/1970 | McMaster et al. | 310/325 X |
| 4,562,374 | 12/1985 | Sashida | 310/323 X |

OTHER PUBLICATIONS

Dielectric Resonators by R. D. Richtmyer, Journal of Applied Physics, vol. 10, 1939, pp. 391–398.

*Primary Examiner*—Mark O. Budd

[57] ABSTRACT

This invention is an improved traveling wave ring resonator utilizing only one source of waves. The standard traveling wave ring resonator uses two wave sources phased 90 degrees apart and physically separated by a quarter wavelength to separately excite two equal-frequency standing wave modes which make up a traveling wave. The present invention uses perturbations of the ring resonator to shift the frequency of the standing wave modes, by specified amounts, and to correctly fix their position, to allow a single wave source to properly excite the standing wave modes which comprise a traveling wave. This invention has application to traveling wave ring resonators in acoustics, mechanical devices, and electromagnetic devices, as well as to simply-connected resonators to be excited in rotating wave modes. Specific applications include improved thermoacoustic traveling wave heat engines and pumps, simplified surface wave motors, and energy efficient wave pools for recreational purposes.

14 Claims, 18 Drawing Figures

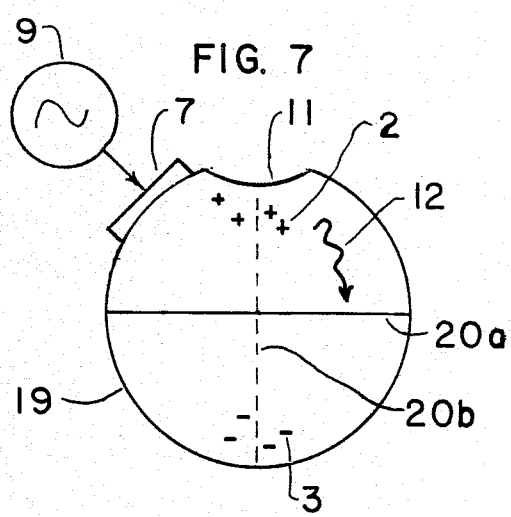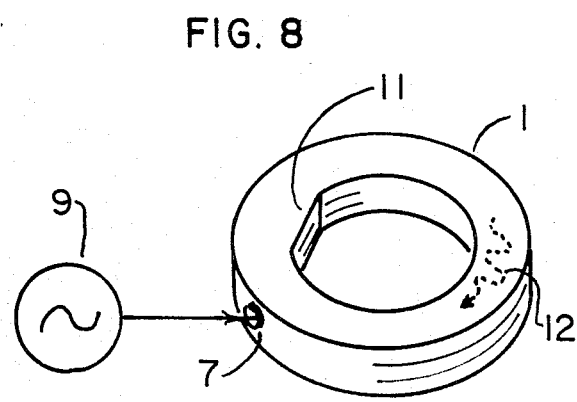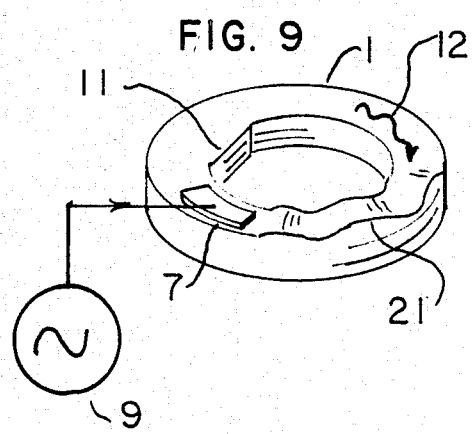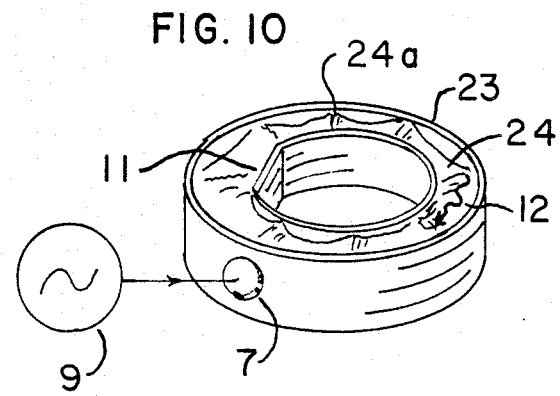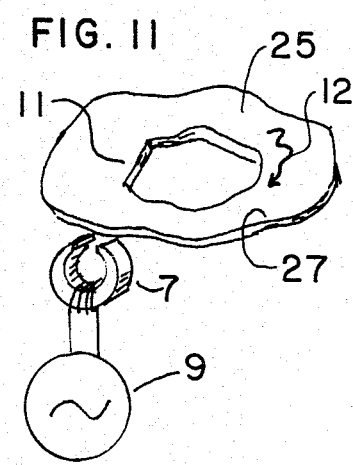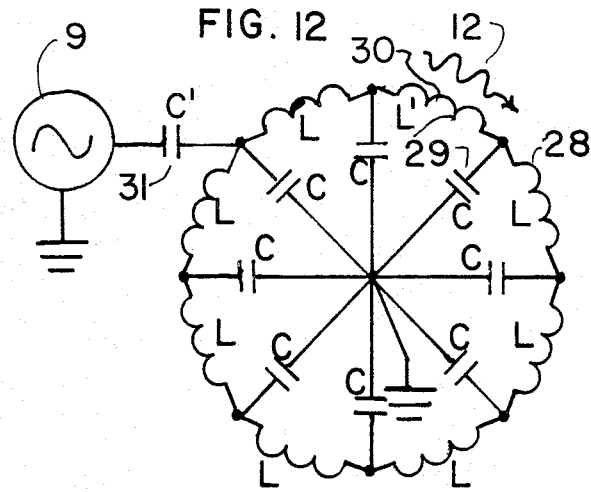

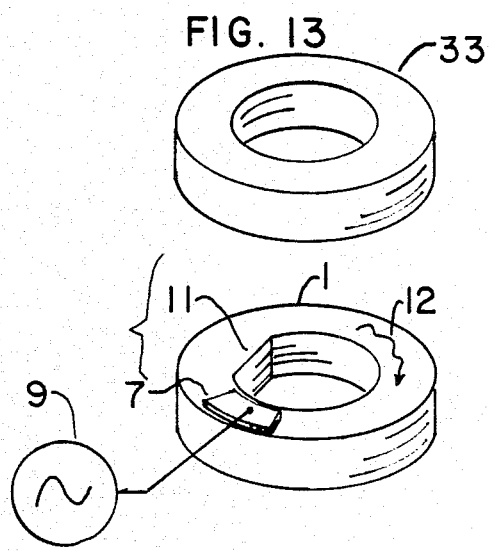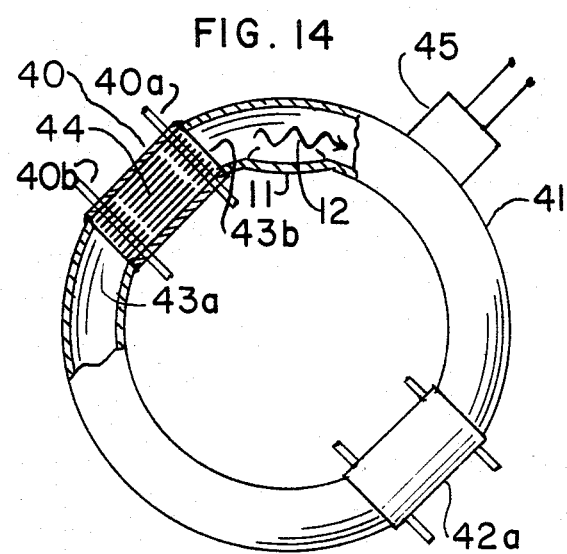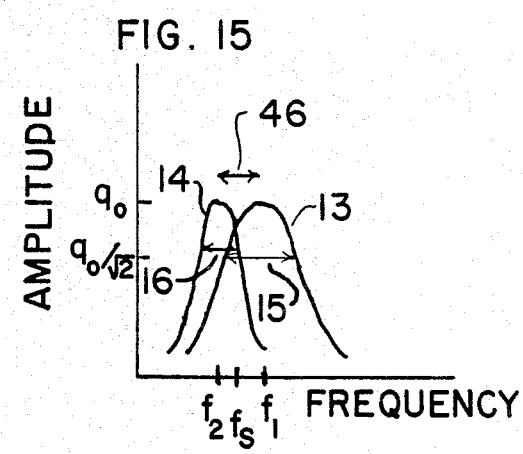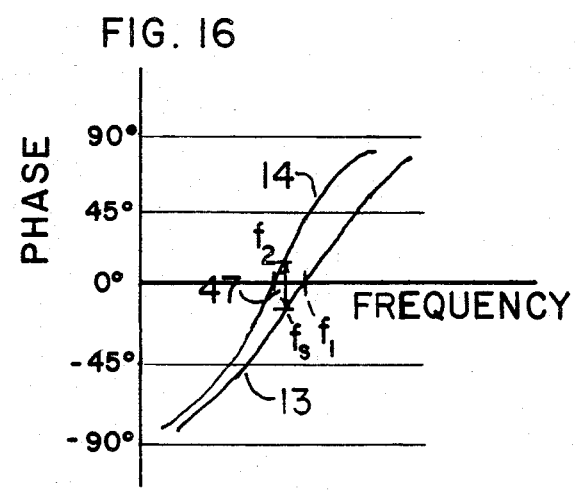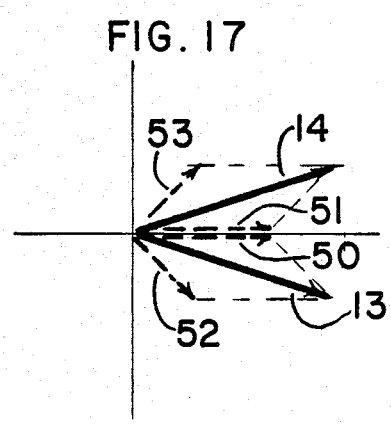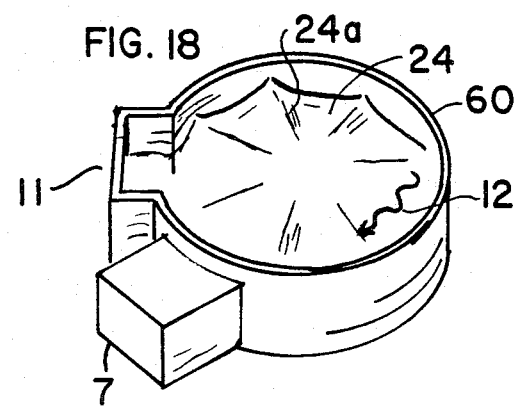

SPLIT MODE TRAVELING WAVE RING-RESONATOR

BRIEF SUMMARY OF THE INVENTION

This invention relates to ring resonators with a simplified system for exciting traveling waves in the resonators. It also relates to simply-connected resonators with a simplified system to excite rotating waves in them.

Simple resonators are capable of sustaining standing wave type resonant modes. Ring resonators, on the other hand, are capable of sustainng both standing and traveling wave modes. These types of modes are related and in fact a traveling wave can be considered to be the simultaneous excitation of two equal frequency standing wave modes phased 90 degrees apart and with one mode shifted a quarter wave length around the ring resonator from the other. The standard method of exciting traveling waves in ring resonators is based on this principle and involves two wave sources phased 90 degrees apart and located a quarter wavelength apart to independently excite the two standing wave modes to create a traveling wave.

The present invention uses one or more perturbations in the ring resonator to split the standing wave frequencies and allow excitation of traveling waves in a ring resonator using a single exciting source or multiple sources of a single phase. The reduction in wave sources and electrical power sources simplify and lessen the cost of traveling wave ring resonators, as well as making possible traveling wave excitation in cases where only a single phase exciting source is normally present, as in a traveling wave heat engine. This invention can also be used for the excitation of rotating waves in simply-connected resonators which are analogous to traveling waves in ring resonators.

It is the object of this invention to provide a simplier method for exciting traveling waves in ring resonators.

Another object of this invention is to make possible single point excitation of traveling waves in ring resonators.

Another object of this invention is to provide a simplification of a thermoacoustic traveling wave heat engine with the possibility of simple impedance enhancement.

Another object of this invention is to provide a rotary surface wave motor with a simplier electrical drive.

Another object of this invention is to provide simple excitation of traveling waves in ring resonators of various wave media, such a acoustical, mechanical (such as flexure waves, or surface waves), and electromagnetic (electrical and optical).

Another object of this invention is to provide for simple excitation of rotating modes in resonators of simple-connected geometry, these modes being similar to the traveling waves modes in ring resonators.

BRIEF DESCRIPTION OF THE DRAWINGS

FIG. 7 is a diagram showing the nodal structure and principle elements of a split mode rotating wave resonator.

FIG. 8 is a perspective view of a metal pipe type split mode traveling wave resonator which can be used for either acoustic or electromagnetic traveling waves depending on the type of wave source used.

FIG. 9 is a perspective view of a solid surface wave type split mode traveling wave resonator.

FIG. 10 is a perspective view of a liquid surface wave split mode traveling wave ring resonator.

FIG. 11 is a perspective view of a flexure wave (an example of a mechanical type wave) split mode traveling wave ring resonator.

FIG. 12 is a circuit diagram of an electronic split mode ring resonator made of descrete elements.

FIG. 13 is an exploded view of a surface wave motor embodying a split mode traveling ring resonator.

FIG. 14 is a cross sectional view of a thermoacoustic traveling wave heat engine embodying a split mode traveling wave ring resonator.

FIG. 15 is a graph of the resonance curves (amplitude versus frequency) of a traveling wave heat engine using reduced mode splitting as a means to enhance the acoustic impedance at the sites of the regenerators.

FIG. 16 is a graph of the phases of the two standing wave modes in a resonant traveling wave heat engine relative to the phase of the regenerator's output waves, showing the phase difference of the two modes.

FIG. 17 is a phasor diagram showing the addition of the two modes in a resonant traveling wave heat engine which add to a standing wave and a traveling wave as is required for proper operation.

FIG. 18 is a perspective view of a water wave type split mode rotating wave resonator to be used for recreational purposes.

THEORY OF OPERATION

Figure 1:
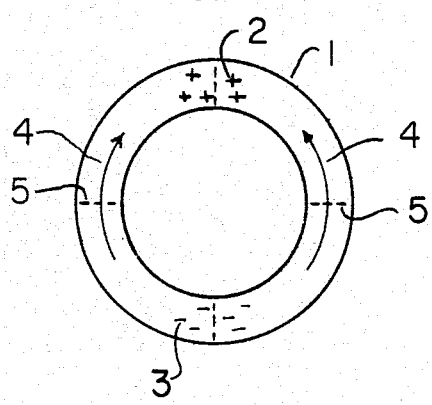
FIG. 1 is a diagram of a standing wave mode in a ring resonator.

The waves in the various types of ring resonators such as acoustical, surface, mechanical or electromagnetic can quantified by two types of wave parameters: potential ones and kinetic ones. For example, in acoustical ring resonators these parameters are the wave induced fluctuating pressure and fluctuating fluid velocity, respectively, while in electromagnetic resonators, they are the electric and magnetic fields associated with the waves. FIG. 1 shows a diagram of a uniform ring resonator (numeral 1) with a standing wave shown at one instant in time. The potential parameter maxima (e.g. the pressure maxima) and minima are indicated as plus signs (numeral 2) and minus signs (numeral 3), respectively. The kinetic parameter (e.g. fluid velocity) is shown with arrows (numeral 4). The nodes, or regions where the potential parameter is zero are indicated by numerals 5. In a uniform ring resonator, the equation for such a standing wave (neglecting, for the moment, variations across to wave guide width) of angular frequency $\omega$ can be expressed as:

$$q = q_0 \sin k(x-x_1) \sin(\omega t + \phi), \quad (1)$$

where q is a parameter of the wave such as displacement, velocity, strain, or electric or magnetic field, q0 is a constant, k is the wave number ($k = 2\pi/\lambda$, where $\lambda$ is the wave length inside the resonator), x is the position coordinate around the inside of the ring, $x_1$ is the position offset of the standing wave, t is time, and $\phi$ is the phase constant. The variables $\omega$ and k are related by $\omega/k = v$, where v is the phase velocity of the waves around the inside of the resonator. In order for q to be a single valued function, the variables $\omega$, k, and $\lambda$ (which are simply related above) can only take on certain values:

$$\omega = \pi n v/l, \; k = 2\pi n/l, \; \text{and} \; \lambda = l/n. \quad (2)$$

where l is the distance around the inside center of the ring resonator, and n is an integer and can assume values of 1, 2, 3, 4, and so on, (n=1 for the mode shown in FIGS. 1 and 2) The phase constant $\phi$ in Eq. 1 is related to the phase of the driving source $\phi_s$ by:

$$\phi - \phi_s = \arctan[2(f_0 - f_s)/\Delta f], \quad (3)$$

$f_0$ is a resonant frequencies ($f_0 = \omega/2\pi$ and $\omega$ is given by Eq. 2), $f_s$ is the wave source's frequency, and $\Delta f$ is the bandwidth of that resonant frequency or resonance ($\Delta f$ is set by the damping or losses of the resonant mode and is defined in the present document to be the width of the resonance curve at 0.707 the peak amplitude or one half the peak power). In a uniform ring resonator the position offset $x_1$ is fixed, not by the resonator's geometry which is completely symmetric, but by the position of the wave source which will fix $x_1$ such as to bring a maxima of the standing wave mode at the source's position.

Figure 2:
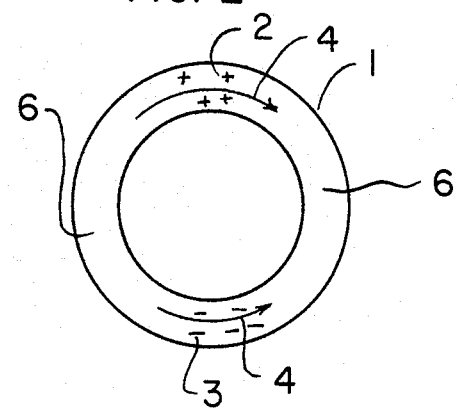
FIG. 2 is a diagram of a traveling wave mode in a ring resonator.

FIG. 2 shows the potential and kinetic parameters in the same uniform ring resonator 1 for a traveling wave (the plus signs 3 and the minus signs 4 indicate regions of maxima and minima potential parameters in FIG. 1). Note that the regions of zero potential parameter 6 move around the ring with time, whereas the nodes (numeral 5 in FIG. 1) for a standing wave are stationary. The equation for a traveling wave excited in a uniform ring resonator can be expressed as:

$$p = p_0 \sin(\pm kx + \omega t + \phi_1), \quad (4)$$

where k and $\omega$ are still given by Eq. 2 and the $\pm$ sign is related to the direction of propagation of the traveling waves around the the ring resonator, clockwise or counter clockwise. Simple algebraic manipulations can transform Eq. 4 into:

$$p = \pm p_0 \sin kx \sin(\omega t + \phi_1 + 90°) + p_0 \sin k(x + \tfrac{1}{4}\lambda) \sin(\omega t + \phi_1), \quad (5)$$

i.e. showing that the traveling wave of Eq. 4 is equal to the superposition of two standing waves such as specified by Eq. 1, one with $x_1 = 0$, $\phi = \phi_1 + 90°$ (or $\phi_1 = \pi/2$ radians) and the other with $x_1 = -\lambda/4$, $\phi = \phi_1$. Thus, a traveling wave of frequency $\omega$ can be considered to be the superposition of two standing waves of the same frequency $\omega$, one displaced from the other by $\lambda/4$ (i.e. the $x_1$'s differ by a quarter wave length) and phased ninety degrees apart.

Because standing and traveling waves are so interrelated, I should clear up some terminology at this point. "Traveling wave" in this document, unless otherwise modified, is meant to be a single traveling wave expressible by Eq. 5, but not the superposition of two such waves which can comprise a standing wave. Likewise, "standing wave", unless other wise modified, is meant to be a single standing wave expressible in the form of Eq. 1 and not the combination of two such waves which together can comprise a traveling wave.

Figure 3:
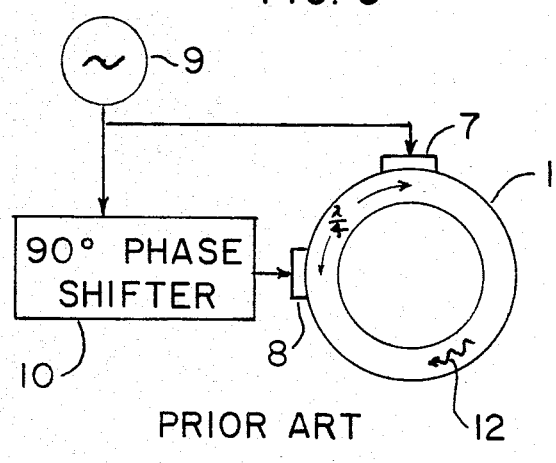
FIG. 3 is a block diagram of the standard (prior art) two phased sources method of exciting traveling waves in a ring resonator.

The standard method for exciting traveling waves in a ring resonator 1 is shown in FIG. 3 and is based on the idea of Eq. 5 that the traveling wave can be decomposed into two standing waves with a ninety degrees phase shift between them and $\lambda/4$ position offset between them (e.g. see U.S. Pat. No. 4,504,760). The method involves use of two wave sources, numerals 7 and 8, phased ninety degrees apart (FIG. 3 shows a single oscillator 9 directly driving one wave source 7 and driving the other wave source 8 through a 90 degrees phase shifter 10) and located $\lambda/4$ apart around the resonator to independently power the two appropriately phased and located standing waves to form a traveling wave 12 (shown symbolically).

Figure 4:
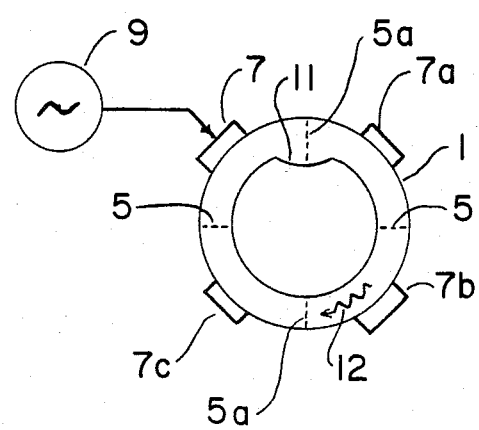
FIG. 4 is a diagram showing the principle elements of a split mode traveling wave ring resonator.

The present invention, shown in FIG. 4, uses one or more perturbations 11 in the ring resonator 1 to render the resonator non-uniform and alter its modal structure. To be effective, such perturbations should effect the characteristic wave impedance of the ring resonator and generally could be implemented by creating a perturbation in the geometry (as generally shown in the drawings) and/or in one or more of the intrinsic properties of the wave medium (e.g. creating a perturbation in the density of an acoustic wave medium). The perturbations do several things to the standing wave modes. First the perturbations split and shift in frequency the resonance, making two distinct standing wave resonances (now only approximated by the Eqs. 1 and 2), for each value of the integer n. For a given value of n, one resonant mode will have a resonant frequency which is slightly higher than that given in Eq. 2, while the other will have one that is slightly lower. Secondly, the perturbation will fix the position (or $x_1$'s) of the resonances relative to the perturbation locations and independent of the position of the source of waves. For the two modes associated a single value of n, the $x_1$'s will differ from each other by $\lambda/4$. For a ring resonator with a single, localized perturbation, the $x_1$'s of the two modes of a given n value will be such as to locate maximum of one of the modes at the same site. In general for more complex perturbation arrangements, the two modes will be located so that the maxima of the first modes will be located at the sites of the minima of the second mode and vice versa.

For proper operation, the perturbations, operating frequency $f_s$, and the resonant frequencies $f_1$ and $f_2$ in the present invention need to be adjusted so that they are related by:

$$f_1 = f_s + \tfrac{1}{2}\Delta f_1 \; \text{and} \; f_2 = f_s - \tfrac{1}{2}\Delta f_2, \quad (6)$$

Figure 5:
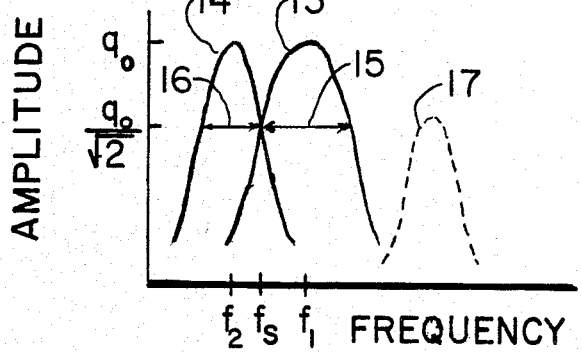
FIG. 5 is a graph of the standing wave resonance curves, (the amplitude versus frequency) of a split mode traveling wave ring resonator.

Such resonance spacing is shown in FIG. 5. As given by Eq. 3 and shown in FIG. 6, the phase constant $\phi$ of the two modes will differ from that of the generator by:

$$\phi - \phi_s = \arctan[2(f_0 - f_s)/\Delta\omega] = \arctan(\pm\Delta f/\Delta f) = \pm 45°, \quad (7)$$

+45° for the $f_0 = f_1$ mode and −45° for the $f_0 = f_2$ mode. Thus, $$\phi_1 - \phi_2 = (\phi_1 - \phi_s) - (\phi_2 - \phi_s) = 45° - (-45°) = 90°. \quad (8)$$

Thus provided that the two modes are simultaneously driven by the same wave source of frequency $f_s$, the phases of the two modes will differ from each other by the required 90°. As mentioned above, the two modes are already separated by the required $\lambda/4$, independent of the wave source. Thus the present method achieves the correct phasing and separation of the two modes so that they comprise a traveling wave while using a single wave source.

One additional requirement is that all other standing wave modes of the ring resonator be essentially non-overlapping so as not to destroy the almost pure traveling wave status of our resonator. That is that they all be far enough removed in frequency from $f_s$ that the wave source operating at $f_s$ does not appreciably excite any of them. One possibel rule of thumb might be that each of these other modes be located at least four of their own bandwidths away $f_s$ where they at most might be excited to an amplitude of one eighth of that of either of the standing wave modes being used.

In order to simultaneously excite both standing wave modes, the wave source should be located around the resonator at a position between and roughly equidistant from adjacent maxima of the two resonant modes, such as the position shown in FIG. 4, numerals 7, 7a, 7b, or 7c. The selection of the particular site out of the several possible sites that meet these criteria determines the direction of propagation of the waves. FIG. 4 shows four possible wave source sites (numerals 7, 7a, 7b, and 7c) for a n=2 traveling wave excitation. Sites 7 and 7b would result in one direction of wave propagation, while either of the other two site would result in the other direction of wave propagation. Note that there is also the possibility of attaching several wave sources to the ring and driving them simultaneously (with a single phase signal) to provide increased power to the waves. Only the sites that result in the same direction of traveling wave propagation should be simultaneously used. For the n−1 mode system shown in FIG. 4, this would mean powering two opposite wave sources (e.g. 7 and 7b) for one direction of wave propagation or powering the other sources (e.g. 7a and 7c) for wave propagation in the other direction. Another option is to provide one or more wave sources on both types of sites and to electrically switch between these to reverse the wave direction.

ROTATING MODES

The present invention also has application to resonators of simply-connected geometry as shown in FIG. 7 (numeral 19) that approximate objects of revolution such as cylinders, spheres, cones, or disks with minor perturbations. It can be used to excite rotating modes in such resonators which in their perimeter regions are similar to traveling waves in ring resonators. The two types of resonators differ primarily in that there is a wave field in the central region of these resonators and none in the central region of ring resonators. FIG. 7 shows the modal structure (with plus signs 2 and minus signs 3 in regions of positive and negative potential parameter and a solid line 20a indicating a nodal line) for a m=1, n=1 mode in a cylindrical resonator. The equation for these modes (ignoring variations in the axial direction for the moment) in a cylindrical resonator is given by:

$$q = q_0 J_m(kr) \cos m\theta \cos \omega t, \quad (9)$$

where $m = 0,1,2,3, \ldots$, $n = 1,2,3, \ldots$, $J_m$ is a Bessel function, $r$ is the radial coordinate, $\theta$ is the angular coordinate, and the wave number $k_{mn}$ equals the $n^{th}$ root $u_{mn}$ of $J_m$ divided by the resonators radius a (i.e. $k_{mn} = u_{mn}/a$). The mode in FIG. 7 corresponds to $m=1$, $n=1$. If the perturbation (11 in FIG. 7) is introduced to the resonator, the $m=1$, $n=1$ mode is split and the two modes are each spacially fixed. One mode is positioned as discussed above, while the other has is nodal lines at right angles to this as shown as dotted lines 20b. Note that the two modes have the same nodal structure, except that one is rotated 90 degrees from the the other, positioning the nodes of this second mode at the locations of the maxima of the first mode.

By exciting both these modes with a 90 degrees phase shift between them, one can create rotating modes in which the wave crests rotate around the central point as given by the equation:

$$q = q_0 J_m(kr) \cos(m\theta - \omega t). \quad (10)$$

Analogous to exciting traveling waves in ring resonators, one can excite the two standing wave modes that comprise the rotating mode either independently as is the prior art for ring resonators, or using one properly positioned wave source as shown in FIG. 7 (numeral 7), providing that the perturbation (numeral 11) and the driving frequency $f_s$ have been adjusted so that the resonant frequencies of the two modes equal $f_s + \frac{1}{2}\Delta f_1$ and $f_s - \frac{1}{2}\Delta f_2$ and that there are no other standing wave modes within a few bandwidths of $f_s$.

Rotating modes are not limited to perfect cylindrical resonators, but also can be excited in resonators which only roughly approximate objects of revolution. For example, shapes such as squares, pentagons, hexagon, etc. and even resonators with long thin projections are possibilities, particularly for the lower order modes which are often not very sensitive to the exact shape of the walls of the resonator. Since these resonators already have built in perturbations or deviations from a cylinder, all that is additionally required is that Eq. 6 be satisfied by the two similar modes being used, that the wave source be located equidistant from two adjacent maxima of the two modes, and that all other modes be essentially non-overlapping with $f_s$ as discussed in connection with ring resonators.

HIGHER ORDER MODES OR TRAVELING AND ROTATING WAVES

In both the ring resonators and the simply-connected resonators discussed above, I have described and illustrated the present invention with low order modes to enhance the simplicity and clarity of this teaching. However, it should be pointed out that use of higher order modes is practical providing that $f_s$ is separated from the unwanted modes by several of their bandwidths. Depending on the bandwidths of the unwanted modes, this may be harder to accomplish for many higher order modes because of the general increase in density of modes at the higher frequencies. I should also point out the possibility of higher order ring resonator modes to include modes which are similar to higher order wave guide modes which have standing wave structure from wall to wall across the resonator. They also can have nodal lines running around the ring parallel to the walls. Likewise, three dimensional simply-connected resonators can have structure in the radial direction (as provided for in Eqs. 9 and 10 for n>1) and in the axial direction (not provided for in the equations). A further complication which the simple explanation of rotating modes above did not delve into is the possible variations in boundary conditions for the various wave system: some requiring zero potential parameter at the resonator wall and some requiring a maximum of the potential parameter there, and some are still more complex than either of these possibilities and depend on the exact character of the resonator's wall (e.g. an optical fiber). While the mode equations are inappropriate for these, the general conditions for split mode excitation laid down in and around Eq. 6 still hold and the application of the present invention to all these more complex resonators is straightforward.

DESCRIPTION OF THE PREFERRED EMBODIMENTS

FIG. 4 shows the the present invention in its general form (its function is described above in detail) with ring resonator 1, two similar standing wave modes with two nodes each (numerals 5 and 5a), a perturbation 11 to separate the frequencies of these two modes and fix their locations, and wave source 7 (located midway between adjacent maxima of the two modes to excite both modes equally), driven with an oscillator 9 and alternate wave source locations and/or additional wave sources 7a, 7b, and 7c. The resulting traveling wave 12 is shown symbolically.

FIG. 5 illustrates the required frequency relationship of the two standing wave modes. Numerals 13 and 14 indicate the resonance curves of the two standing wave modes with the perturbation in place (these two modes being separated in frequency by the average of their bandwidths 15 and 16). The frequency $f_s$ of the oscillator (and wave source) differs in frequency by a half bandwidth from the peak of each resonance. The wave source should excite the two modes roughly equally as indicated in FIG. 5 by the equal peak heights. For proper operation, all other modes of the resonator should be essentially non-overlapping in frequency with $f_s$. Numeral 17 illustrates such an essentially non-overlapping nearby resonance shown to be about five of its bandwidths from $f_s$.

Figure 6:
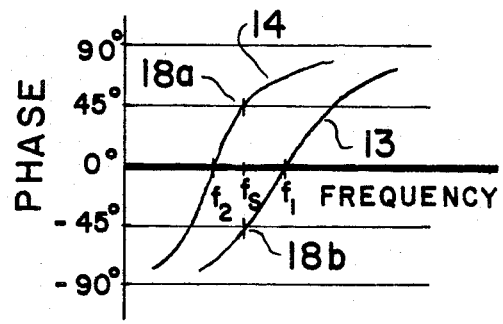
FIG. 6 is a graph of the phase difference between the standing wave resonant modes and that of the wave source versus frequency, indicating the proper operating phase difference for a split mode traveling wave ring resonator.

FIG. 6 indicates the phase relationship of the modes 13, 14 and wave source. If the conditions of Eq. 6 are met at the operating frequency $f_s$, one standing wave mode will lead the wave source by 45° (indicated by numeral 18a) and the other will lag the wave source by 45° (indicated by numeral 18b). Thus the two mode will differ in phase by 90° at the operating frequency $f_s$.

FIG. 7 shows a general simply-connected cylindrical resonator 19, with two (similar) m=1, n=1 modes, (their lines of nodes are indicated by numerals 20a and 20b, while the plus and minus signs (numerals 2 and 3) indicate a maximum and minimum at one instant of time for the mode with node 20a), with perturbation 11 to separate the frequencies of these two modes (by the average of their bandwidths) and fix their locations as shown, and wave source 7 located midway between two maxima of the two modes on the walls to excite both modes roughly equally. Oscillator 9 drives the wave source. This setup will excite a rotating mode 12 (shown symbolically) in the resonator. For proper operation, all other modes of the resonator should be essentially non-overlapping with $f_s$.

FIG. 8 shows a square cross section metal pipe bent around and joined to itself to form a ring resonator 1. It has a perturbation 11, a wave source 7, and driving oscillator 9. This setup can sustain traveling waves 12 (shown symbolically) in a ring resonator of either the electromagnetic type or the acoustic type, depending on the type of wave source 7 installed. Note that electromagnetic ring resonators can also be constructed of dielectric materials [see for example, Richtmyer, J. Appl. Phys. 10, pp. 391–398, (1939)] or from sections of transmission lines (e.g. coaxial cables, twin lines, strip lines, etc.) bent around and joined to make loops. Acoustic ring resonators can also be made of rings of solid material or a hollow pipe (of almost any cross sectional geometry) filled with a liquid or gas.

FIG. 9 shows a solid ring resonator 1, with perturbation 11, surface wave source or transducer 7 attached to the resonator surface at a location such a prescribed above and driven by oscillator 9. This setup will sustain traveling surface waves 12 (shown symbolically, also wave crests 21 shown) such as required for surface wave motors as described more fully below.

The electromagnetic, acoustical, and surface wave acoustical traveling wave ring resonators could be used in signal generation and processing. Such devices can simultaneously serve to filter signals and generate output signals of several phases (tapped out of the ring at any number of points). Alternatively, a movable tapping point out would allow an adjustable phase shift. Another application would be an antenna based on ring resonators to couple to circularly polarized electromagnetic radiation. Surface wave ring resonators also find use in surface wave motors as discussed below in connection with FIG. 13 while acoustic ring resonators also find utility in thermoacoustic heat engines as discussed below in connection with FIG. 14.

FIG. 10 shows a ring shaped tank 23 of liquid with a free surface 24 which comprises a ring resonator. The tank has perturbation 11 and wave source 7 in its wall, driven by oscillator 9. Provided the perturbation and driving frequency are properly related as described above, this setup will sustain traveling waves 12 (shown symbolically) with wave crests 24a.

Free surface liquid traveling wave ring resonators could find use as recreational wave tanks that "recycle" their waves and thereby consume less power than conventional wave tanks and have phase velocities closer to those of natural water waves than the higher order modes often used in conventional wave tanks to conserve power. Such water wave ring resonators would be very similar to the rotating mode resonator shown in FIG. 18 and discussed below.

FIG. 11 shows a thin ring shaped disk 25 with a hole in its center to form a mechanical resonator designed to resonate in a flexure wave. Numeral 27 indicates the crest of a traveling flexure wave, while numeral 12 symbolically indicates the whole traveling wave. The resonator has a perturbation 11, and attached wave source 7 (shown as an magnetic type transducer) and driving oscillator 9.

FIG. 12 shows an electronic ring resonator made of descrete components: inductors 28 and capacitors 29 to sustain traveling waves 12 (shown symbolically) in the voltage and currents in these components. The perturbation consists of one inductor 30 being of a different value than the rest (a differently sized capacitor could also be used as a perturbation). The wave source in this case is a coupling capacitor 31 attached to an oscillator 9 and the ring resonator at a point midway between the two standing wave maxima. This circuit could find use in generating properly phased signals which are simultaneously filtered or simply as a convenient phase shifter.

FIG. 13 shows a circular surface wave motor with rigid rotor 33, surface wave ring resonator 1 having a perturbation 11, wave source or transducer 7, driving oscillator 9, and resulting traveling wave 12, shown symbolically. This would operate similar to other surface wave motors [e.g. see U.S. Pat. No. 4,504,760] with the difference that only one source or phase of electrical power need be provided for operation. The elimination of the circuitry to provide the second phase of power and the second transducer should make this invention less costly. Note that the wave source 7 can be piezoelectric in nature, magnetic (e.g. such as the pole pieces in conventional motors), or mechanical (e.g. fluid driven).

FIG. 14 shows a thermoacoustic, traveling wave heat engine consisting of a regenerator section 40 (which contains heat input and output 40a and 40b, acoustical input and output 43a and 43b, and a solid packing material 44 [see U.S. Pat. No. 4,114,380]) connected to the acoustic circuit 41 which returns part of the acoustic output of the regenerator section back into its input. A second regenerator section 42a is optional. This is also a correct alternate location for the regenerator section. The acoustic-to-electric transducer 45 represents one way to use the acoustical energy created in this device and, in this case, produce electrical power. The regenerator section 42 and feedback pipe 41 comprise a ring resonator which has perturbation 11. This regenerator section powers the wave and is located midway between adjacent maxima of the two standing wave modes being used (the 45° spacing from regenerator section to the perturbation as shown is appropriate for an n−1 mode). For pure traveling waves 12 (shown symbolically), the ring resonator (including the perturbation) should have a geometry such that the modes are separated in frequency by the average of their bandwidths and that there be no other standing wave resonances within a few bandwidths of $f_s$. Given this, the resonator section will amplify the traveling wave mode at a frequency $f_s = f_1 - \frac{1}{2}\Delta f_1 = f_2 + \frac{1}{2}\Delta f_2$. Compared to the invention of U.S. Pat. No. 4,114,380, the present invention represents a new, unobvious, and simplified way to achieve the matching required and get the output of the regenerator section to power the ring resonator given their differences in acoustic impedance.

One method of reducing losses in a traveling wave heat engine is to add in properly positioned standing waves [see U.S. Pat. No. 4,355,517] to increase the effective wave impedance at the regenerator site. If properly done the regenerator still experiences a pure traveling wave as it needs for proper operation, but at an increased impedance. (Elsewhere in the resonator, with the exception of one spot halfway around the ring, there is a mix of standing and traveling waves.) One can use the present invention to accomplish this proper addition of standing waves by simply reducing the perturbation 11, such that the frequency split 46 between the modes (13 and 14) is less than the average of the bandwidths (15 and 16, in FIG. 15). In this case the phase difference (numeral 47, FIG. 16) between the two standing wave modes is less than 90°. As indicated in the phasor diagram, FIG. 17, one can decompose these standing waves (13 and 14) into waves in-phase (numerals 50 and 51) and waves 90°-out-of-phase (numerals 52 and 53). The in-phase waves add up to a standing wave (not shown, but 1.414 times either 50 or 51. It is a factor of 0.707 smaller than a simple addition of 50 and 51 because of the λ/4 offset of the two modes) having a maxima at the wave source (i.e. the regenerator's site) as is needed for the enhanced impedance traveling wave heat engine [U.S. Pat. No. 4,355,517]. The 90°-out-of-phase waves add up to a pure traveling wave (of amplitude equal to the magnitude of vector 52 or vector 53 but not shown in FIG. 17) as we saw in Eq. 4 and as is also needed for the proper operation of this device. The effective impedance at the regenerator site is determined by the ratio of standing to traveling wave amplitudes which is in turn set by the perturbation size and consequent resonance curve separation as shown in FIG. 15. Numeral 42a in FIG. 14 shows the correct location for a second optional regenerator section in this device, at opposition around the ring where pure traveling waves (at enhanced impedances) exist the same as in the first location 40. This could also be considered an alternate location. Note that while in a regular traveing wave heat engine, there may be a number of possible regenerator sites, in a resonant traveling wave heat engine there are only two correct sites. Compared with the invention of U.S. Pat. No. 4,355,517, the present invention represents a new, unobvious, and simplified way to achieve both the required matching and the required mix of standing and traveling waves.

FIG. 18 shows an almost circular swimming pool 60 filled with water 24, and made with a perturbation 11 (this perturbation could be adjustable if desired by using a movable wall, piston, bladder, or float) and wave source 7 (with self contained oscillator). If properly adjusted to meet Eq. 6, it will sustain rotating waves 12 (shown symbolically and also wave crest 24a shown) for use as a recreational wave pool. Similar to a ring resonator wave pool, this setup should require less energy than the conventional recreational wave pool in that the waves are rotating (being recycled) as opposed to being created and traveling to a dissipation region. The phase velocity of these rotating waves should be closer to that of a normal water wave and slower than that the high order traveling wave modes sometimes used in regular wave tanks to conserve power. This should make the waves easier to ride on surf boards or floats. As noted for general rotating wave resonators, such a rotating mode wave tank need not be perfectly circular, but might be a shape of some regular polygon, or other roughly circular shape as long as the modes and operating frequencies can be adjusted to meet the conditions of Eq. 6 and that other non-useful mode are several bandwidths removed from $f_s$.

I claim:

1. A split mode traveling wave ring resonator comprising:

A. a ring resonator means including at least one perturbation means in the characteristic impedance around the ring, such that the ring resonator has two standing wave resonant modes; one of these modes shifted around said ring resonator means from the other, and having resonant frequencies of approximately $f_s + \frac{1}{2}\Delta f_1$ and $f_s - \frac{1}{2}\Delta f_2$, where $f_s$ is the operating frequency of the resonator and $\Delta f_1$ and $\Delta f_2$ are the half power bandwidths of these first and second standing wave modes respectively; all other standing wave modes of the ring resonator are essentially non-overlapping with $f_s$ and B. at least one wave generating means coupled with the ring resonator, said wave generating means all being of about the same phase and positioned around the ring approximately equidistant from two adjacent standing wave maxima, one a maxima of one of the modes and one of the other mode, the wave generating means constructed to couple wave energy of frequency $f_s$ to both modes of the resonator with roughly equal strength.

2. The split mode traveling wave ring resonator of claim 1 in which said resonator and resonant modes are of the acoustic type, with either a gas, liquid, or solid wave medium.

3. The split mode traveling wave ring resonator of claim 1 in which said resonator and resonant modes are of the solid surface acoustic wave type.

4. The split mode traveling wave ring resonator of claim 1 in which said resonator and resonant modes are of the liquid surface wave type.

5. The split mode traveling wave ring resonator of claim 4 in which said liquid is water.

6. The split mode traveling wave ring resonator of claim 1 in which said resonator and resonant modes are of the mechanical type.

7. The split mode traveling wave ring resonator of claim 1 in which said resonator and resonant modes are of the electromagnetic type.

8. The split mode traveling wave ring resonator of claim 1 in which said resonator is made of discrete elements.

9. A circular surface wave motor comprising:
a circular ring resonator made of solid material, with at least one wave generating means coupled with the surface wave modes of the ring resonator, and a rigid circular rotor in contact with that surface of the ring resonator at the positions of the surface wave crests; the rotor being made to rotate relative to the circular ring resonator by the motion of the traveling surface waves crests, wherein the improvement comprises:

A. said circular ring resonator further including at least one perturbation means in the characteristic impedance around the rings, such that the ring resonator has two standing wave resonant modes; one of these modes shifted around said ring resonator from the other, and having resonant frequencies of approximately $f_s + \frac{1}{2}\Delta f_1$ and $f_s - \frac{1}{2}\Delta f_2$, where $f_s$ is the operating frequency of the resonator and $\Delta f_1$ and $\Delta f_2$ are the half power bandwidths of these first and second standing wave modes respectively; all other standing wave resonant modes of the ring resonator are essentially non-overlapping with $f_s$ and B. said wave generating means furthermore being all of approximately the same phase, positioned around the ring resonator approximately equidistant from two adjacent standing wave maxima, one a maxima of one of the modes and one of the other mode, the wave generating means constructed to couple wave energy of frequency $f_s$ to both modes of the resonator with roughly equal strengths.

10. A traveling wave heat engine/pump comprising:
at least one regenerator section with acoustical input and output, and thermal input and output, and an acoustical circuit connected to said acoustical input and output and constructed to feed back some of the acoustical waves from the acoustical output to the acoustical input, the feedback part of the acoustical circuit and the acoustical path between the input and output through the regenerator section comprising an acoustic ring resonator, wherein the improvement comprises:

A. said acoustical ring resonator further including at least one perturbation means in the characteristic impedance around the ring, such that the ring resonator has two standing wave resonant modes; one of these modes shifted around said ring resonator from the other, and having resonant frequencies of approximately $f_s + \frac{1}{2}\Delta f_1$ and $f_s - \frac{1}{2}\Delta f_2$, where $f_s$ is the operating frequency of the resonator and $\Delta f_1$ and $\Delta f_2$ are the half power bandwidths of these first and second standing wave modes respectively; all other standing wave modes of the ring resonator are essentially non-overlapping with $f_s$, and B. said regenerator section furthermore being positioned around the ring resonator approximately equidistant from two adjacent standing wave maxima, one a maxima of one of the modes and one of the other mode, the regenerator section constructed to couple wave energy of frequency $f_S$ to both modes of the resonator with approximately equal strength.

11. A resonant traveling wave heat engine/pump comprising:
a regenerator section with acoustical input and output and thermal input and output, and an acoustical circuit connected to said acoustical input and output and constructed to feed back some of the acoustical waves from the acoustical output to the acoustical input, the feedback part of the acoustical circuit and the acoustical path between the input and output through the regenerator section comprising an acoustic ring resonator, wherein the improvement comprises:

A. said acoustic ring resonator further including at least one perturbation means in its characteristic impedance around the ring, such that the ring resonator has two standing wave resonant modes; one of these mode shifted around the ring resonator from the other, and having resonant frequencies of approximately $f_s + (\Delta f_1/2g)$ and $f_s - (\Delta f_2/2g)$, where $f_s$ is the operating frequency of the resonator and $\Delta f_1$ and $\Delta f_2$ are the half power bandwidths of these first and second standing wave modes respectively, and g is the regenerator impedance enhancement factor which is greater than unity; all other standing wave modes of the ring resonator are essentially non-overlapping with $f_s$, and B. said regenerator section furthermore positioned around the ring approximately equidistant from two adjacent standing wave maxima, one a maxima of one of the modes and one of the other mode, the regenerator section constructed to couple wave energy of frequency $f_S$ to both modes of the resonator with approximately equal strength.

12. A resonant traveling wave heat engine/pump comprising:
two regenerator sections each with acoustical input and output and thermal input and output, and an acoustical circuit connected to the acoustical inputs and outputs of said regenerator sections and constructed to channel some of the acoustical waves from the acoustical output of one regenerator section to the acoustical input of the second regenerator section and some of the acoustical output of tht second regenerator section to the acoustical input of the first regenerator section, said acoustical circuit and the acoustical paths between the inputs and outputs through the regenerator sections comprising an acoustic ring resonator, wherein the improvement comprises:

A. said acoustic ring resonator further including at least one perturbation means in its characteristic impedance around the ring, such that said ring resonator has two standing wave resonant modes; one of these modes shifted around the ring resonator from the other, and having resonant frequencies of approximately $f_s+(\Delta f_1/2g)$ and $f_s-(\Delta f_2/2g)$, where $f_s$ is the operating frequency of the resonator and $\Delta f_1$ and $\Delta f_2$ are the half power bandwidths of these first and second standing wave modes respectively, and g is the regenerator impedance enhancement factor which is greater than unity; all other standing wave modes of the ring resonator being essentially non-overlapping with $f_s$, and B. said regenerator sections furthermore positioned at opposition around the ring and also each approximately equidistant from two adjacent standing wave maxima, one a maxima of one of the modes and one of the other mode, the regenerator sections constructed to couple wave energy to both modes of the resonator with approximately equal strengths.

13. A split mode rotating wave resonator comprising:
A. a simply-connected resonator, approximating an object of revolution including at least one perturbation means in the cylindrical symmetry, such that the resonator has two standing wave resonant modes, with one of these mode rotated around the axis of symmetry from the other, and with resonant frequencies of approximately $f_s+\frac{1}{2}\Delta f_1$ and $f_s-\frac{1}{2}\Delta f_2$, where $f_s$ is the operating frequency of the resonator and $\Delta f_1$ and $\Delta f_2$ are the half power bandwidths of these first and second standing wave modes respectively; all other standing wave modes of the resonator being essentially non-overlapping with $f_s$, and B. at least one generating means coupled with the resonator, said wave generating means all being of about the same phase and positioned around the ring approximately equidistant from two adjacent standing wave maxima, one a maxima of one of the modes and one of the other mode, the wave generating means constructed to couple wave energy of frequency $f_s$ to both modes of the resonator with approximately equal strengths.

14. The split mode rotating wave resonator of claim 13 in which the resonator and resonant modes are of the water wave type.

* * * * *